(12) United States Patent
Xia et al.

(10) Patent No.: US 11,521,988 B2
(45) Date of Patent: Dec. 6, 2022

(54) THREE-DIMENSIONAL MEMORY DEVICE ERASE OPERATION

(71) Applicant: YANGTZE MEMORY TECHNOLOGIES CO., LTD., Wuhan (CN)

(72) Inventors: Shiyu Xia, Wuhan (CN); Feng Xu, Wuhan (CN); Lei Jin, Wuhan (CN); Jie Yuan, Wuhan (CN); Xuezhun Xie, Wuhan (CN); Wenqiang Chen, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 17/214,255

(22) Filed: Mar. 26, 2021

(65) Prior Publication Data
US 2022/0293626 A1  Sep. 15, 2022

Related U.S. Application Data

(63) Continuation of application No. PCT/CN2021/079930, filed on Mar. 10, 2021.

(51) Int. Cl.
*H01L 27/115* (2017.01)
*H01L 27/11582* (2017.01)
(Continued)

(52) U.S. Cl.
CPC ........ *H01L 27/11582* (2013.01); *G11C 16/08* (2013.01); *G11C 16/24* (2013.01);
(Continued)

(58) Field of Classification Search
None
See application file for complete search history.

(56) References Cited

U.S. PATENT DOCUMENTS

| 10,373,697 B1 | 8/2019 | Lai et al. |
| 2016/0064090 A1* | 3/2016 | Yuan ............... G11C 16/14 365/185.17 |

(Continued)

FOREIGN PATENT DOCUMENTS

| CN | 105938723 A | 9/2016 |
| CN | 111758132 A | 10/2020 |

OTHER PUBLICATIONS

International Search Report issued in corresponding International Application No. PCT/CN2021/079930, dated Dec. 2, 2021, 4 pages.

*Primary Examiner* — James G Norman
(74) *Attorney, Agent, or Firm* — Bayes PLLC

(57) ABSTRACT

Implementations of the present disclosure provide 3D memory devices and methods for operating the 3D memory devices. In an example, a 3D memory device includes a plurality of memory layers and a dummy memory layer between the plurality of memory layers and a NAND memory string extending through the memory layers and the dummy memory layer. The NAND memory string includes a source, a drain, and a plurality of memory cells at intersections with the plurality of memory layers and between the source and the drain. The 3D memory device also includes a peripheral circuit configured to erase the plurality of memory cells. To erase the plurality of memory cells, the peripheral circuit includes a word line driving circuit configured to apply a positive bias voltage on the dummy memory layer.

20 Claims, 10 Drawing Sheets

(51) Int. Cl.
  *H01L 27/1157*    (2017.01)
  *H01L 27/11556*   (2017.01)
  *H01L 27/11524*   (2017.01)
  *G11C 16/24*      (2006.01)
  *H01L 27/11526*   (2017.01)
  *G11C 16/30*      (2006.01)
  *G11C 16/08*      (2006.01)
  *H01L 27/11573*   (2017.01)

(52) U.S. Cl.
  CPC .......... *G11C 16/30* (2013.01); *H01L 27/1157* (2013.01); *H01L 27/11524* (2013.01); *H01L 27/11526* (2013.01); *H01L 27/11556* (2013.01); *H01L 27/11573* (2013.01)

(56) References Cited

U.S. PATENT DOCUMENTS

| | | | |
|---|---|---|---|
| 2016/0180939 A1* | 6/2016 | Louie | G11C 7/14 365/185.19 |
| 2019/0252029 A1 | 8/2019 | Lai et al. | |
| 2020/0013469 A1 | 1/2020 | Pachamuthu et al. | |

* cited by examiner

THREE-DIMENSIONAL MEMORY DEVICE ERASE OPERATION

CROSS-REFERENCE TO RELATED APPLICATIONS

This application is continuation of International Application No. PCT/CN2021/079930, filed on Mar. 10, 2021, entitled "THREE-DIMENSIONAL MEMORY DEVICE ERASE OPERATION," which is hereby incorporated by reference in its entirety.

BACKGROUND

The present disclosure relates to three-dimensional (3D) memory devices and operation methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

In one aspect, the present disclosure provide a 3D memory device. The 3D memory device includes a plurality of memory layers and a dummy memory layer between the plurality of memory layers and a NAND memory string extending through the memory layers and the dummy memory layer. The NAND memory string includes a source, a drain, and a plurality of memory cells at intersections with the plurality of memory layers and between the source and the drain. The 3D memory device also includes a peripheral circuit configured to erase the plurality of memory cells. To erase the plurality of memory cells, the peripheral circuit includes a word line driving circuit configured to apply a positive bias voltage on the dummy memory layer.

In another aspect, the present disclosure provide a method for erasing memory cells in a 3D memory device. The 3D memory device includes a plurality of memory layers and a dummy memory layer between the plurality of memory layers, and a NAND memory string extending through the memory layers and the dummy memory layer. The NAND memory string includes a source, a drain, and a plurality of memory cells at intersections with the plurality of memory layers and between the source and the drain. The method includes applying a positive bias voltage on the dummy memory layer.

In a further aspect, the present disclosure further provide a system. The system includes a 3D memory device configured to store data. The 3D memory device includes a plurality of memory layers and a dummy memory layer between the plurality of memory layers, and a NAND memory string extending through the memory layers and the dummy memory layer. The NAND memory string includes a source, a drain, and a plurality of memory cells at intersections with the plurality of memory layers and between the source and the drain. The 3D memory device also includes a peripheral circuit configured to erase the plurality of memory cells. To erase the plurality of memory cells, the peripheral circuit includes a word line driving circuit configured to apply a positive bias voltage on the dummy memory layer.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

Figure 1:
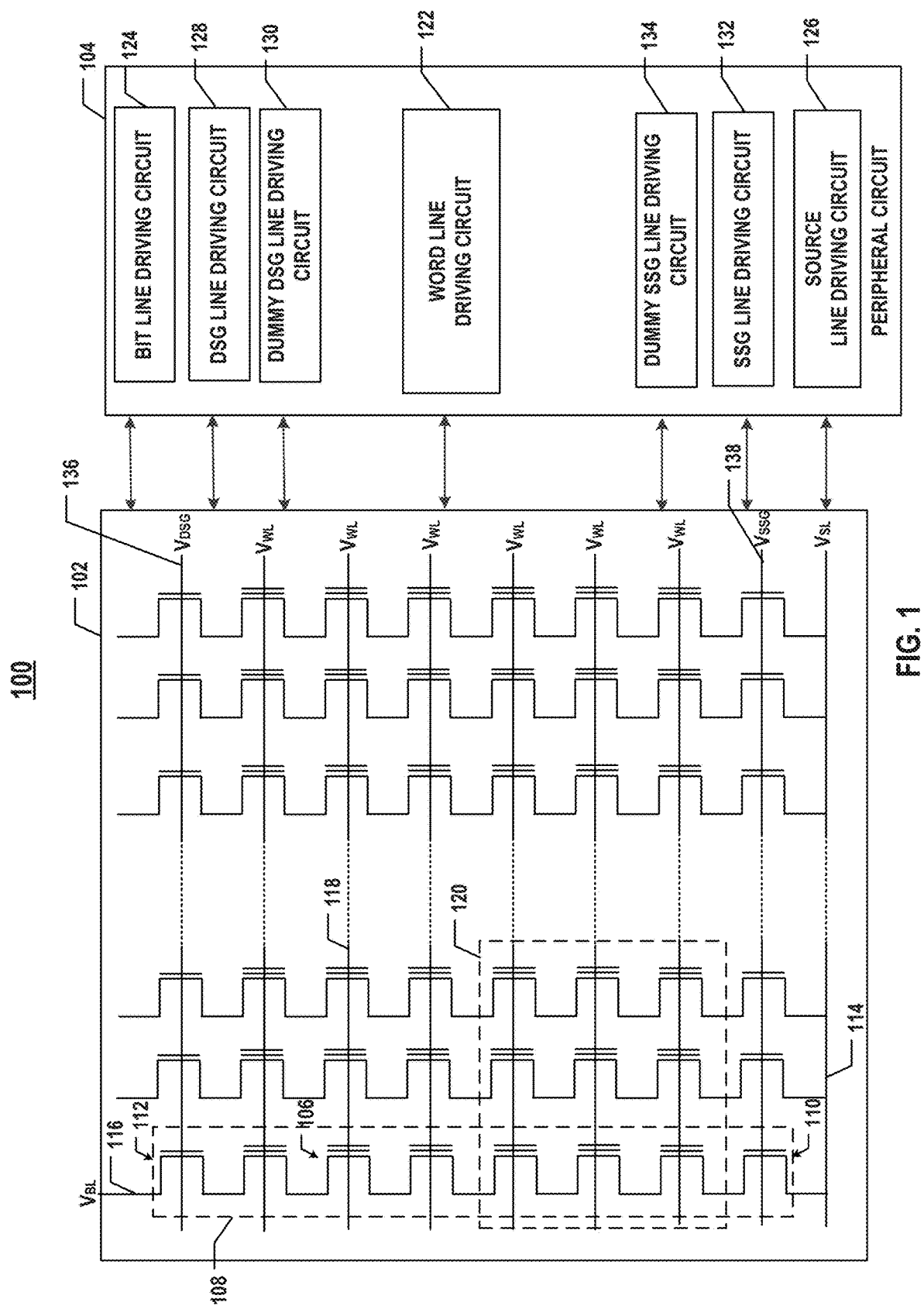
FIG. 1 illustrates a diagram of an exemplary 3D memory device, according to some aspects of the present disclosure.

Aspects of the present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present discloses.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means perpendicular to the lateral surface of a substrate.

As the demand for higher storage continues to increase, 3D NAND memory devices with an increased number of levels (e.g., memory layers) are employed. Memory strings are formed extending through the memory layers, creating arrays of memory cells. To perform an erase operation to the memory cells, holes are commonly injected into the semiconductor channels of the memory strings to sustain a positive potential in the memory strings. The holes can be generated from P-wells under the memory strings. However, the increased number of levels in 3D NAND memory devices makes it more difficult to timely and effectively transport the holes from the bottom to the top of the semiconductor channel. As a result, fluctuation can occur in the erase operation, and some memory cells are not effectively erased. As a remedy, gate-induce-drain-leakage (GIDL)-assisted body biasing for erase operation (or GIDL erase operation) has been used to improve the erase efficiency and effectiveness. In a typical GIDL erase operation, the bit line and source line electrically connected to a memory string are each applied with a high positive voltage so that holes are generated and injected from the ends, e.g., from beyond a drain-select gate (DSG) and a source-select gate (SSG), of the memory string into the semiconductor channel. However, sometimes, the holes can still distribute unevenly in the semiconductor channel in such erase operation due to the increased number of levels in the 3D NAND memory devices, resulting in some memory cells not be effectively erased. The erase operation in the 3D NAND memory devices needs to be improved.

To address the aforementioned issues, the present disclosure introduces an erase operation scheme for 3D memory devices, in particular, 3D NAND memory devices, with improved erase efficiency and effectiveness. The novel erase operation scheme can be performed alone or in combination with the GIDL erase operation. According to the disclosed erase operation scheme, high positive voltages are applied on dummy memory layers between the source and drain of each memory string to create holes. The dummy memory layers can be located in any suitable location, e.g., between the DSG and the SSG, in the memory deck of a 3D NAND memory device. In an example, the dummy memory layers are located near the interface(s) of a multi-deck 3D NAND device. In another example, the dummy memory layers are located away from the interface(s) of a multi-deck 3D NAND device. In a further example, the dummy memory layers can be located in a single-deck 3D NAND device.

The high positive voltages can have any suitable values to enable a band-to-band-tunneling (BTBT) current to be generated in the semiconductor channels when the dummy memory layers are biased. The BTBT current, e.g., the holes, can thus be injected vertically from the location(s) it was generated to other parts of the semiconductor channel. In an example, the disclosed erase operation is used in combination with the GIDL erase operation such that the dummy memory layers are biased with the high positive voltages when the DSG and SSG of a memory string are also biased with respective high positive voltages. In some implementations, the high positive voltages applied on the dummy memory layers are lower than the high positive voltages applied on the source and the drain of a memory string. In some implementations, the DSG and/or the SSG of the 3D NAND memory device are applied with a respective positive voltage during the disclosed erase operation to optimize the hole generation/injection condition in a semiconductor channel. The holes generated by biasing the dummy memory layers can compensate for the holes generated in GIDL erase operation. Thus, the holes generated between the DSG and SSG and the holes generated beyond the DSG and SSG can thus together improve the density and distribution of holes in the semiconductor channel of a memory string. In other words, the holes can be transported to the memory cells more effectively and can be distributed more evenly in these memory cells. The erase efficiency of the 3D NAND memory device can be improved.

FIG. 1 illustrates a diagram of an exemplary 3D memory device 100, according to some aspects of the present disclosure. 3D memory device 100 can include a memory array device 102 and a peripheral circuit 104 connected to memory array device 102. Memory array device 102 can be a 3D NAND Flash memory device in which memory cells 106 are provided in the form of an array of NAND memory strings 108 each extending vertically above a substrate (not shown). In some implementations, each NAND memory string 108 includes a plurality of memory cells 106 connected in series and stacked vertically. Each memory cell 106 can hold a continuous, analog value, such as an electrical voltage or charge, that depends on a number of electrons trapped within a region of memory cell 106. Each memory cell 106 can be either a "floating gate" type of memory cell including a floating-gate transistor or a "charge trap" type of memory cell including a charge-trap transistor.

In some implementations, each memory cell 106 is a single-level cell (SLC) that has two possible memory states and thus, can store one bit of data. For example, the first memory state "0" can correspond to a first range of voltages, and the second memory state "1" can correspond to a second range of voltages. In some implementations, each memory cell 106 is a multi-level cell (MLC) that is capable of storing more than a single bit of data in more than four memory states. For example, the MLC can store two bits per cell, three bits per cell (also known as triple-level cell (TLC)), or four bits per cell (also known as a quad-level cell (QLC)). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 1, each NAND memory string 108 can include a source select gate (SSG) 110 at its source end and a drain select gate (112) at its drain end. SSG 110 and DSG 112 can be configured to activate selected NAND memory strings 108 (columns of the array) during erase, read, and program operations. In some implementations, SSGs 110 of NAND memory strings 108 are connected to one or more SSG lines 138, and DSGs 112 of NAND memory strings 108 are connected to one or more DSG lines 136. In some implementations, the drain of each NAND memory string 108 is connected to a respective bit line 116, and sources of NAND memory strings in the same memory blocks, e.g., an array common source (ACS), are connected to a same source line 114, e.g., a common source line. DSG line 136 may apply a DSG voltage $V_{DSG}$ on one or more DSGs 112, and SSG line 138 may apply an SSG voltage $V_{SSG}$ on one or more SSGs 110, for various read, program, and erase operations of 3D memory device 100. Bit line 116 may apply a bit-line voltage $V_{BL}$ on the drain of NAND memory string 108, and source line 114 may apply a source-line voltage $V_{SL}$ on the source of NAND memory string 108.

Memory cells 106 of adjacent NAND memory strings 108 can be connected through word lines 118 that select which memory blocks of memory cells are affected by erase operations. In some implementations, a plurality of word lines 118 are connected to memory cells of a memory block 120, which is the smallest physically-addressable data unit for erase operations. The size of memory block 120 in bits can correspond to the number of NAND memory strings 108 connected by word lines 118. Each word line 118 can include a plurality of control gates at each memory cell 106 in respective memory block 120 and a gate line coupling the control gates. To erase memory cells 106 in a selected memory block 120, source line 114 connected to the selected memory block 120 may be biased with a high positive voltage (e.g., 20 V), and word lines 118 in the selected memory block 120 may be connected to the common ground (i.e., GND voltage or 0 V). In a GIDL erase operation, in addition to source line 114, bit lines 116 of a selected memory block 120 are also biased with a high positive voltage (e.g., 20 V).

Figure 2A:
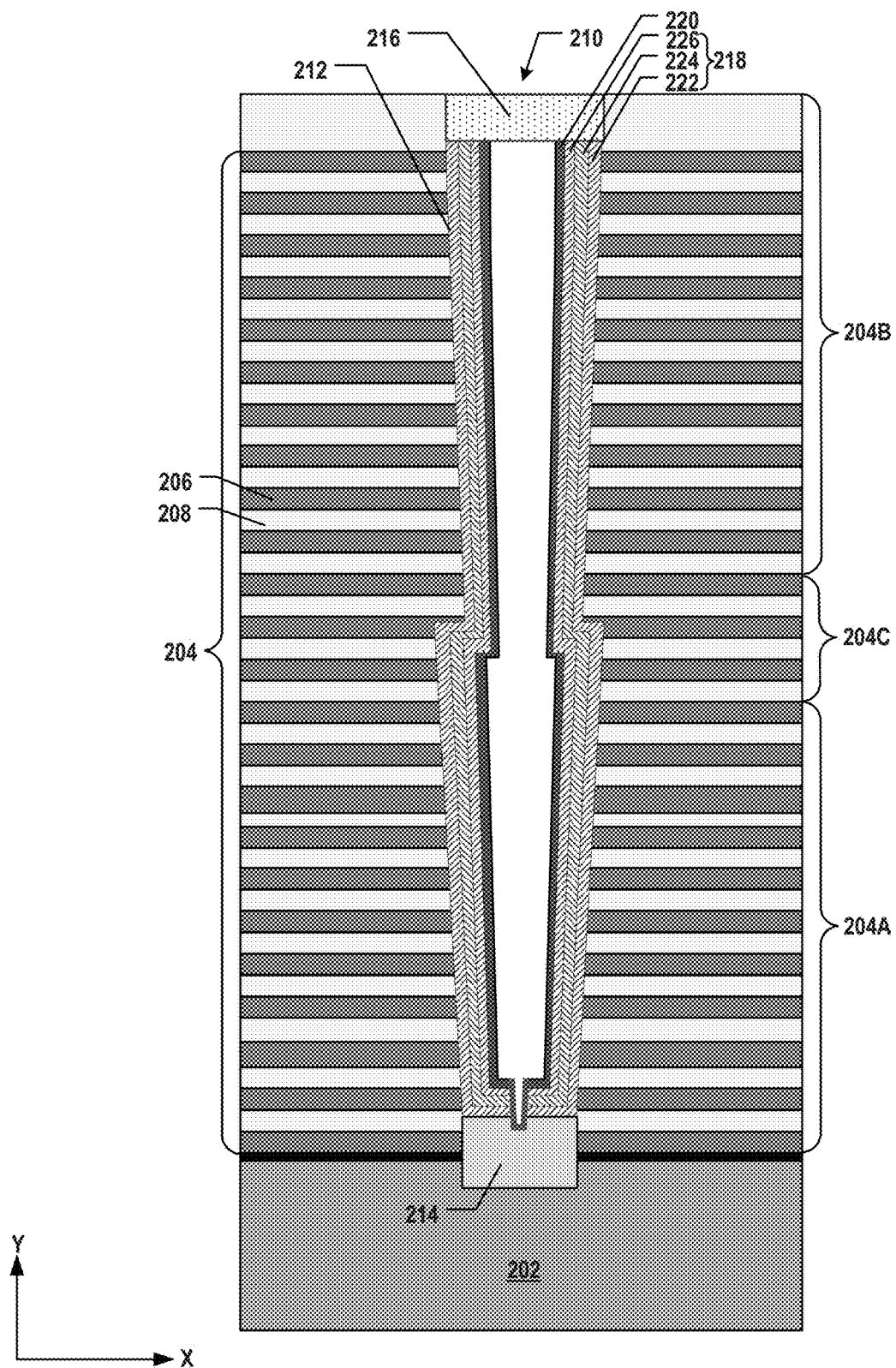
FIG. 2A illustrates a cross-section of an exemplary memory array device, according to some aspects of the present disclosure.

FIG. 2A illustrates a cross-section of an exemplary memory array device 200, according to some aspects of the present disclosure. Memory array device 200 is an example of memory array device 102 illustrated in FIG. 1. As shown in FIG. 2A, memory array device 200 includes a 3D NAND memory string 210 (e.g., NAND memory string 108 in FIG. 1) extending vertically above a substrate 202. Substrate 202 can include silicon (e.g., single crystalline silicon), silicon germanium (SiGe), gallium arsenide (GaAs), germanium (Ge), silicon on insulator (SOI), germanium on insulator (GOI), or any other suitable materials. It is noted that x and y axes are included in FIG. 2A to further illustrate the spatial relationship of the components in memory array device 200. Substrate 202 includes two lateral surfaces (e.g., a top surface and a bottom surface) extending laterally in the x-direction (i.e., the lateral direction). As used herein, whether one component is "on," "above," or "below" another component of a semiconductor structure (e.g., memory array device 200) is determined relative to the substrate of the semiconductor structure (e.g., substrate 202) in the y-direction (i.e., the vertical direction or depth direction) when the substrate is positioned in the lowest plane of the semiconductor structure in the y-direction. The same notion for describing the spatial relationship is applied throughout the present disclosure.

As shown in FIG. 2A, 3D NAND memory string 210 extends vertically through a memory stack 204 having interleaved gate conductive layers 206 (also referred to herein as "memory layers") and gate-to-gate dielectric layers 208 above substrate 202. Gate conductive layers 206 and gate-to-gate dielectric layers 208 in memory stack 204 can alternate in the vertical direction. In other words, except for the ones at the top or bottom of memory stack 204, each gate conductive layer 206 can be adjoined by two gate-to-gate dielectric layers 208 on both sides, and each gate-to-gate dielectric layer 208 can be adjoined by two gate conductive layers 206 on both sides. The number of the pairs of gate conductive layers 206 and gate-to-gate dielectric layers 208 in memory stack 204 (e.g., 32, 64, 96, or 128) determines the number of memory cells in memory array device 200. Each gate conductive layer 206, DSG line 136, and SSG line 138 can include conductive materials including, but not limited to, tungsten (W), cobalt (Co), copper (Cu), aluminum (Al), polysilicon, doped silicon, silicides, or any combination thereof. In some implementations, each gate conductive layer 206 includes a metal layer, such as a tungsten layer. In some implementations, each gate conductive layer 206 includes a doped polysilicon layer. Each gate conductive layer/memory layer 206 can include control gates surrounding the memory cells (e.g., memory cells 106 in FIG. 1) of 3D NAND memory string 210 and can extend laterally as a word line (e.g., word lines 118 in FIG. 1). In various implementations of the present disclosure, gate conductive layer 206 can be at any suitable position/level between the drain and the source of the 3D NAND memory string 210.

Memory stack 204 can have a single-deck architecture or a multi-deck architecture. As an example, FIG. 2A shows memory stack 204 having a multi-deck architecture, e.g., a dual-deck memory stack including a lower memory deck 204A above substrate 202 and an upper memory deck 204B above lower memory deck 204A, as shown in FIG. 2A. The numbers of the pairs of gate conductive layers 206 and gate-to-gate dielectric layers 208 in each of lower and upper memory decks 204A and 204B can be the same or different. Each of lower and upper memory decks 204A and 204B can include interleaved gate conductive layers 206 and gate-to-gate dielectric layers 208 as described above.

As shown in FIG. 2A, 3D NAND memory string 210 includes a channel structure 212 extending vertically through lower and upper memory decks 204A and 204B. In some implementations, channel structure 212 includes a channel hole filled with semiconductor material(s) (e.g., as a semiconductor channel 220) and dielectric material(s) (e.g., as a memory film 218). In some implementations, semiconductor channel 220 includes silicon, such as amorphous silicon, polysilicon, or single crystalline silicon. In some implementations, memory film 218 is a composite dielectric layer including a tunneling layer 226, a storage layer 224 (also known as a "charge trap/storage layer"), and a blocking layer 222. Channel structure 212 can have a cylinder shape (e.g., a pillar shape). Semiconductor channel 220, tunneling layer 226, storage layer 224, blocking layer 222 are arranged radially from the center toward the outer surface of the pillar in this order, according to some implementations. Tunneling layer 226 can include silicon oxide, silicon oxynitride, or any combination thereof. Storage layer 224 can include silicon nitride, silicon oxynitride, silicon, or any combination thereof. Blocking layer 222 can include silicon oxide, silicon oxynitride, high dielectric constant (high-k) dielectrics, or any combination thereof. In one example, memory film 218 can include a composite layer of silicon oxide/silicon oxynitride/silicon oxide (ONO).

In some implementations, 3D NAND memory string 210 further includes a semiconductor plug 214 in the lower portion (e.g., at the lower end) of 3D NAND memory string 210. Semiconductor plug 214 can include a semiconductor material, such as single-crystal silicon, which is epitaxially grown from substrate 202 in any suitable direction. Semiconductor plug 214 can function as part of the channel of a source select transistor (e.g., the source select transistor having SSG 110 in FIG. 1) of 3D NAND memory string 210. In some implementations, 3D NAND memory string 210 further includes a channel plug 216 in the upper portion (e.g., at the upper end) of 3D NAND memory string 210. In some implementations, channel plug 216 can function as the channel of a drain select transistor (e.g., the drain select transistor having DSG 112 in FIG. 1) of 3D NAND memory string 210. As used herein, the upper end of a component (e.g., channel structure 212) is the end farther away from substrate 202 in the y-direction, and the lower end of the component (e.g., channel structure 212) is the end closer to substrate 202 in the y-direction when substrate 202 is positioned in the lowest plane of memory array device 200.

In some implementations, 3D NAND memory strings 210 include a plurality of control gates (each being part of gate conductive layer/memory layer 206) for memory cells of 3D NAND memory strings 210. Gate conductive layer 206 can include multiple control gates for multiple 3D NAND memory strings 210 and can extend laterally as a word line ending at the edge of memory stack 204, which can receive word line bias voltages $V_{WL}$ (e.g., as shown in FIG. 1) for controlling operations of the memory cells, e.g., by reading, erasing, and programming operations. It is understood that although not shown in FIG. 2A, additional components of memory array device 200 can be formed including, but not limited to, gate line slits/source contacts, local contacts, interconnect layers, etc.

In FIG. 2A, 3D NAND memory string 210 includes single channel structure 212, which is known as a single-cell formation (SCF) structure. It is understood that in some implementations, 3D NAND memory string 210 may include two channel structures electrically connected by an inter-deck plug (not shown), which is also known as a dual-cell formation (DCF) structure. It is also understood that in some implementations, memory stack 204 may include more than two memory decks, and 3D NAND memory string 210 may include a single channel structure extending vertically through the memory decks or include more than two channel structures, each of which extends vertically through a respective one of the memory decks. For a 3D memory device having a multi-deck memory stack, each of the multiple memory decks can include a plurality of memory layers (e.g., gate conductive layers 206) in the vertical direction. In some implementations, a set of dummy memory layers are formed vertically between adjacent memory decks, such as a group of dummy memory layers 204C vertically between lower and upper memory decks 204A and 204B as shown in FIG. 2A, or dummy memory layers (not shown) surrounding the inter-deck plug in a DCF structure. A dummy memory layer, also referred to as a dummy word line, can have the same physical structure but different electrical configuration as a memory layer, because the memory cells connected by the dummy memory layer are not used for data storage (i.e., as dummy memory cells).

In various implementations, the dummy memory layers can be vertically located at any suitable locations, and are not limited by the number of decks in memory stack 204. For example, the dummy memory layers may be separated from a DSG line (e.g., top-select gate (TSG) line) by one or more memory layers (e.g., gate conductive layers 206) in the vertical direction and may be separated from an SSG line, (e.g., bottom-select gate (BSG) line) by one or more memory layers (e.g., gate conductive layers 206). For example, the memory layers may include at least one group of dummy memory layers (e.g., dummy memory layers 204C), each group including a plurality of dummy memory layers arranged consecutively in the vertical direction. The number of dummy memory layers in each group may be any suitable integer such as 1, 2, 3, 4, 5, etc.

In some implementations, memory stack 204 has a single-deck architecture and one group of dummy memory layers that are positioned at a middle position of memory stack, such that the group of dummy memory layers has the same distance to the DSG line and the SSG line. In some implementations, memory stack 204 has a single-deck architecture and more than one groups of dummy layers that are positioned evenly in memory stack 204 in the vertical direction, such that the distance between adjacent groups is the same as the distance between a top/bottom group to a closest select gate line (e.g., DSG line or SSG line). In some implementations, memory stack 204 has a multi-deck architecture, such as a dual-deck architecture as shown in FIG. 2A. Alternatively or optionally to dummy memory layers 204C, memory stack 204 may have one or more groups of dummy memory layers distributed in upper memory deck 204B and/or lower memory deck 204A. For example, in addition to dummy memory layers 204C, memory stack 204 may have a group of dummy memory layers positioned at a middle position of upper memory deck 204B and/or a middle position of lower memory deck 204A. In some implementations, the group of dummy memory layers in upper memory deck 204B has the same distance to the dummy memory layers 204C and to the DSG line, and/or the group of dummy memory layers in lower memory deck 204A has the same distance to the dummy memory layers 204C and to the SSG line. In another example, as an alternative of dummy memory layers 204C, memory stack 204 may have a plurality of groups of dummy memory layers arranged evenly in memory stack 204. In some implementations, memory stack 204 includes two groups of dummy memory layers. The distance between the DSG line and one group may be at ⅓ the entire distance between the DSG line and the SSG line, and the distance between the SSG line and the other group may be ⅓ the entire distance between the DSG line and the SSG line.

It should be understood that the specific position(s) and the number of group(s) of dummy memory layers in a memory stack may be determined based on the design of memory array device 200 and should not be limited by the aspects of the present disclosure. In some implementations, the position(s) and the number of group(s) of dummy memory layers may optimize the generation, injection, and/or density of holes in semiconductor channel 220 such that the erase operation of memory cells can have improved uniformity and efficiency. In some implementations, the distance between a group of dummy memory layers and another element (e.g., a surface, the DSG line, and the SSG line) may be referred to as the number of memory layers (gate conductive layers 206) between the group and the element.

Referring back to FIG. 1, peripheral circuit 104 can include any suitable digital, analog, and/or mixed-signal circuits used for facilitating the operations of 3D memory device 100. For example, peripheral circuit 104 can include one or more of a data buffer (e.g., a bit line page buffer), a decoder (e.g., a row decoder or a column decoder), a sense amplifier, a driver (e.g., a word line driver), a charge pump, a current or voltage reference, or any active or passive components of the circuits (e.g., transistors, diodes, resistors, or capacitors). In some implementations, peripheral circuit 104 is formed using complementary metal-oxide-semiconductor (CMOS) technology.

In some implementations, peripheral circuit 104 includes a word line driving circuit 122, a bit line driving circuit 124, and a source line driving circuit 126. Word line driving circuit 122 can implement the erase operation schemes disclosed herein for erasing memory cells 106 in memory array device 102. Peripheral circuit 104 may apply suitable voltages to each memory block 120 to implement an erase operation through word lines 118 in the form of word line bias voltages $V_{WL}$ and dummy word line bias voltages $V_{DWL}$. In some implementations, peripheral circuit 104 applies word line bias voltages $V_{WL}$ on gate conductive layers 206 and applies dummy word line bias voltages $V_{DWL}$ on dummy memory layers (e.g., 204C) during an erase operation, as referred back to FIG. 2A. In some implementations, $V_{DWL}$ includes a positive voltage. Bit line driving circuit 124 can select or deselect NAND memory string 108 (and memory cells 106 thereof) by applying a select voltage or a deselect voltage via respective bit line 116 for various memory operations, such as erasing of selected memory cells 106. Bit line driving circuit 124 may apply a positive bit-line voltage on bit line 116 during an erase operation. For example, bit line driving circuit 124 may apply a positive bit-line voltage $V_{BL}$ on bit line 116 during a GIDL erase operation. Source line driving circuit 126 may apply a positive source-line voltage on source line 114 during an erase operation. For example, source line driving circuit 126 may apply a positive source-line voltage $V_{SL}$ on source line 114 during a GIDL erase operation.

In some implementations, peripheral circuit 104 also includes a DSG line driving circuit 128 and an SSG line driving circuit 132. DSG line driving circuit 128 and SSG line driving circuit 132 can respectively implement the erase operation schemes disclosed herein for erasing memory cells 106 in memory array device 102. Peripheral circuit 104 may apply suitable voltages to DSG line 136 and SSG line 138 to implement an erase operation, respectively, in the form of DSG voltage $V_{DSG}$ and SSG voltage $V_{SSG}$. In some implementations, peripheral circuit 104 further includes a dummy DSG line driving circuit 130 and a dummy SSG line driving circuit 134. In some implementations, when a dummy DSG line and/or a dummy SSG line is formed in memory array device 102, respective driving circuit(s), e.g., dummy DSG line driving circuit 130 and/or dummy SSG line driving circuit 134 are employed to implement the erase operation schemes disclosed herein for erasing memory cells 106 in memory array device 102. The dummy DSG may be located between DSG line 136 and word lines 118 (e.g., gate conductive layers 206) and can have the same physical structure, but different electrical configuration, as DSG line 136 because the gates connected by the dummy DSG line are not used for selecting memory cells. The dummy SSG line may be located between SSG line 138 and word lines 118 (e.g., gate conductive layers 206) and can have the same physical structure, but different electrical configuration as SSG line 138 because the gates connected by the dummy SSG are not used for selecting memory cells. Peripheral circuit 104 may apply suitable voltages to the dummy DSG line and the dummy SSG line to implement an erase operation respectively in the form of a dummy DSG voltage $V_{DSGDMY}$ and a dummy SSG voltage $V_{SSGDMY}$ (not shown in FIG. 1).

Figure 2B:
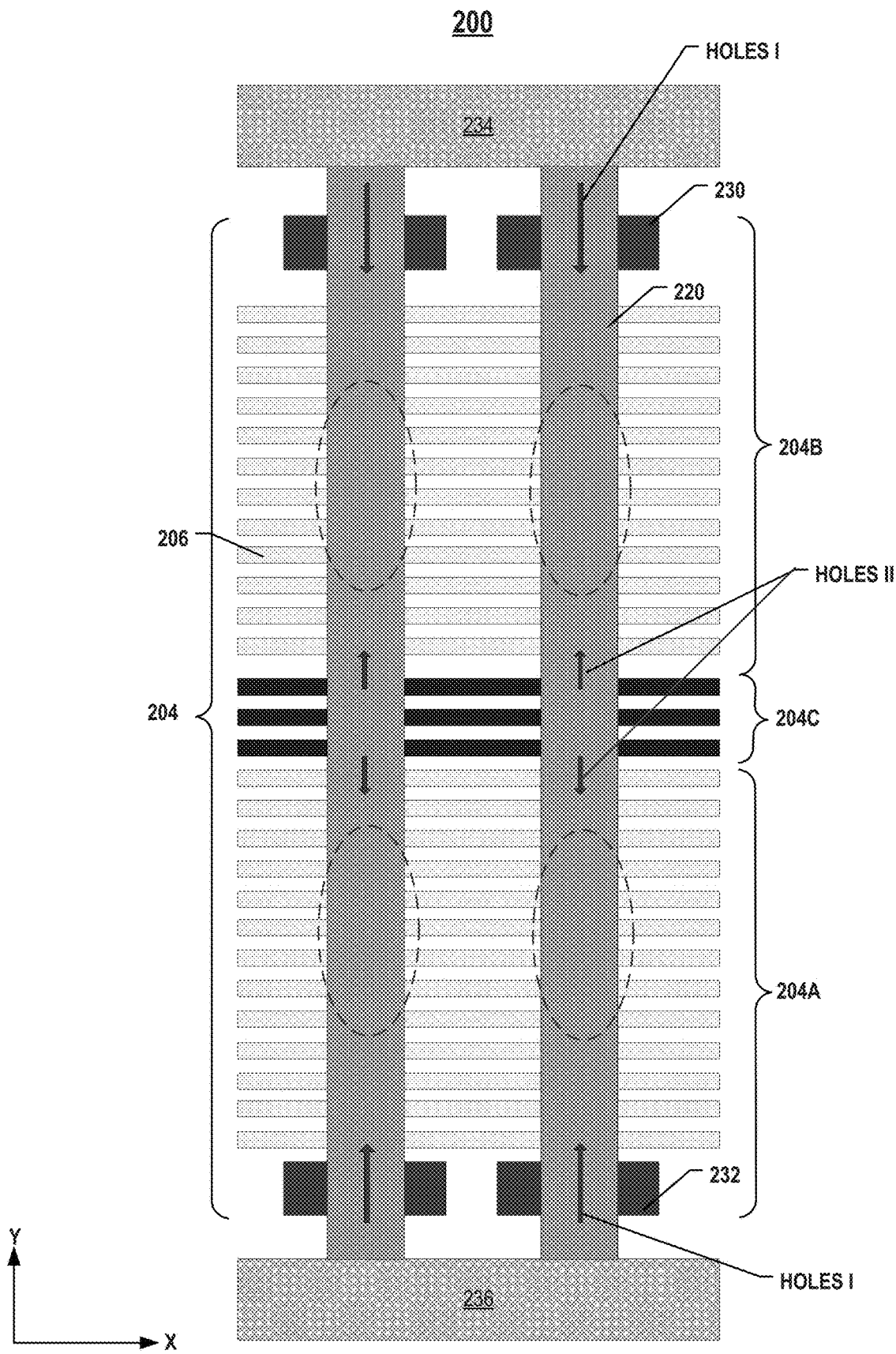
FIG. 2B illustrates certain elements of an exemplary memory array device, according to some aspects of the present disclosure.

FIG. 2B illustrates certain elements of memory array device 200 during an erase operation scheme for memory array device 200, according to some implementations. Memory array device 200 may be a 3D NAND memory device that includes a DSG line (e.g., TSG line) 230 and an SSG line (e.g., BSG line) 232 respectively on the top and bottom portions of memory stack 204. Semiconductor channel 220, as part of 3D NAND memory string 210, may be conductively connected to a bit line 234 and a source line 236. In a GIDL erase operation, bit line driving circuit 124 and source line driving circuit 126 may respectively apply a high positive voltage on bit line 234 and source line 236 such that BTBT current can be generated and flow through DSG line 230 and SSG line 232.

The disclosed erase operation scheme may be operated in combination with a GIDL erase operation. According to implementations of the present disclosure, during an erase operation of memory array device 200, word line driving circuit 122 applies a 0 V-voltage (i.e., GND voltage), e.g., $V_{WL}$, on gate conductive layers 206, and a positive voltage, e.g., $V_{DWL}$, on dummy memory layers 204C. In some implementations, $V_{DWL}$ may have the same value for each dummy memory layer 204C and may range from 12 V to 20 V, such as 12V, 14 V, 15 V, 16 V, 18 V, and 20 V. For example, $V_{DWL}$ may be 16 V. Optionally, DSG line driving circuit 128 may apply a suitable DSG voltage $V_{DSG}$ on DSG line 230, and SSG line driving circuit may apply a suitable SSG voltage $V_{SSG}$ on SSG line 232, during the erase operation. In some implementations, $V_{DSG}$ and $V_{SSG}$ are each equal to 0 V (i.e., GND voltage). In some other implementations, $V_{DSG}$ and $V_{SSG}$ are each equal to a positive value and lower than or equal to $V_{DWL}$, such as ranging from 10 V to 16 V, such as 10 V, 12V, 14 V, 15 V, and 16 V. In an example, $V_{DSG}$ and $V_{SSG}$ are each 10 V. During the GIDL erase operation, bit line driving circuit 124 may apply a positive bit-line voltage $V_{BL}$ on the bit line connected to 3D NAND memory string 210, i.e., bit line 234; and source line driving circuit 126 may apply a positive source-line voltage $V_{SL}$ on the source line connected to 3D NAND memory string 210, i.e. source line 236. $V_{BL}$ and $V_{SL}$ may each be greater than $V_{DWL}$. In some implementations, $V_{BL}$ and $V_{SL}$ may each range from 20V to 25V, such as 20 V, 21 V, 22 V, 23 V, 24 V, and 25 V. In an example, the bit-line voltage and the source-line voltage are each 20 V.

The erase operation of the present disclosure may be employed with GIDL erase operation to improve the erase uniformity and efficiency. As described before, a GIDL erase operation can be created by applying high positive voltages on bit line 234 and source line 236. In some implementations, a respective positive voltage is applied on each of DSG line 230 and SSG line 232. BTBT current, including holes I, as illustrated in FIG. 2B, can be generated in the upper and lower portions of semiconductor channel 220 at the PN junctions formed between DSG line 230/SSG line 232 and doped (e.g., N-doped) regions of 3D NAND memory string 210. Holes I may be injected from the upper and lower portions towards the middle portion of semiconductor channel 220. In some implementations, holes I are injected from the upper and lower ends, passing through portions of semiconductor channel 220 that are electrically connected to DSG line 230 and SSG line 232, towards the portion of semiconductor channel between DSG line 230 and SSG line 232. In the meantime, a positive voltage, having a suitable value to create BTBT current in the portion of semiconductor channel 220 between DSG line 230 and SSG line 232, may be applied on dummy memory layers 204C that are positioned between DSG line 230 and SSG line 232. Accordingly, BTBT current can be generated in the middle portion of semiconductor channel 220 at the PN junctions formed between 3D NAND memory string 210 and dummy memory layers 204C. Holes II in the BTBT current may be injected into semiconductor channel 220, e.g., in the vertical directions (e.g., positive and negative y-directions towards the upper and lower portions of semiconductor channel 220), as illustrated by the arrows in FIG. 2B. The threshold voltages of the memory cells (e.g., memory cells 106) in the memory blocks being erased (e.g., memory block 120, above and/or below dummy memory layers 204C) may be decreased. Accordingly, the memory cells are erased. The holes in the circled portions of semiconductor channel 220 may thus include holes I and II, and the density of holes in these portions may be increased. In some implementations, holes are distributed in semiconductor channel 220 with increased uniformity. Compared to a memory array device without the disclosed erase operation scheme, a nonzero voltage (e.g., positive voltage) is applied on some of the memory layers (i.e., dummy memory layers 204C) to generate additional holes for erase operation, and the density of holes in gate conductive layers 206 (or memory cells 106) of memory block 120 may be increased and/or more uniform. The increased number and/or density of holes can further increase the density of holes in the memory cells (e.g., memory cells 106) formed by 3D NAND memory string 210. The increased and/more uniformed density of holes can improve the neutralization of the holes and electrons moving from the memory layer, and may more efficiently change the threshold voltages of the memory cells to the erase distribution. The decrease of threshold voltages in the memory cells can be more uniform. The erase operation of memory cells 106 may have higher efficiency and uniformity.

In some implementations, although not shown, the disclosed erase scheme may also be operated in combination of a P-well erase operation, increasing the density and/or uniformity of holes in the memory cells. In a P-well erase operation, a P-type doped region, in substrate 202 and conductively connected to semiconductor channel 220, may provide holes that are injected, e.g., upwardly, into semiconductor channel 220. Different from the GIDL operation, a sufficiently high positive voltage may be applied on the P-type doped region. Instead of forming BTBT current, holes can be generated directly from the P-type doped region. In some implementations, the positive voltage may range from 15 V to 21 V, e.g., 20 V. In the P-well erase operation, the voltages applied on the word lines and dummy word lines may be similar to those applied in the GIDL erase operation. In some implementations, the voltages on the select gate lines (e.g., DSG lines and SSG lines), and dummy select gate lines (e.g., dummy DSG lines and dummy SSG lines) may be similar to those applied in the GIDL erase operation. Thus, the detail description of the P-well erase operation in combined with the disclosed erase operation scheme is not repeated herein.

Figure 3:
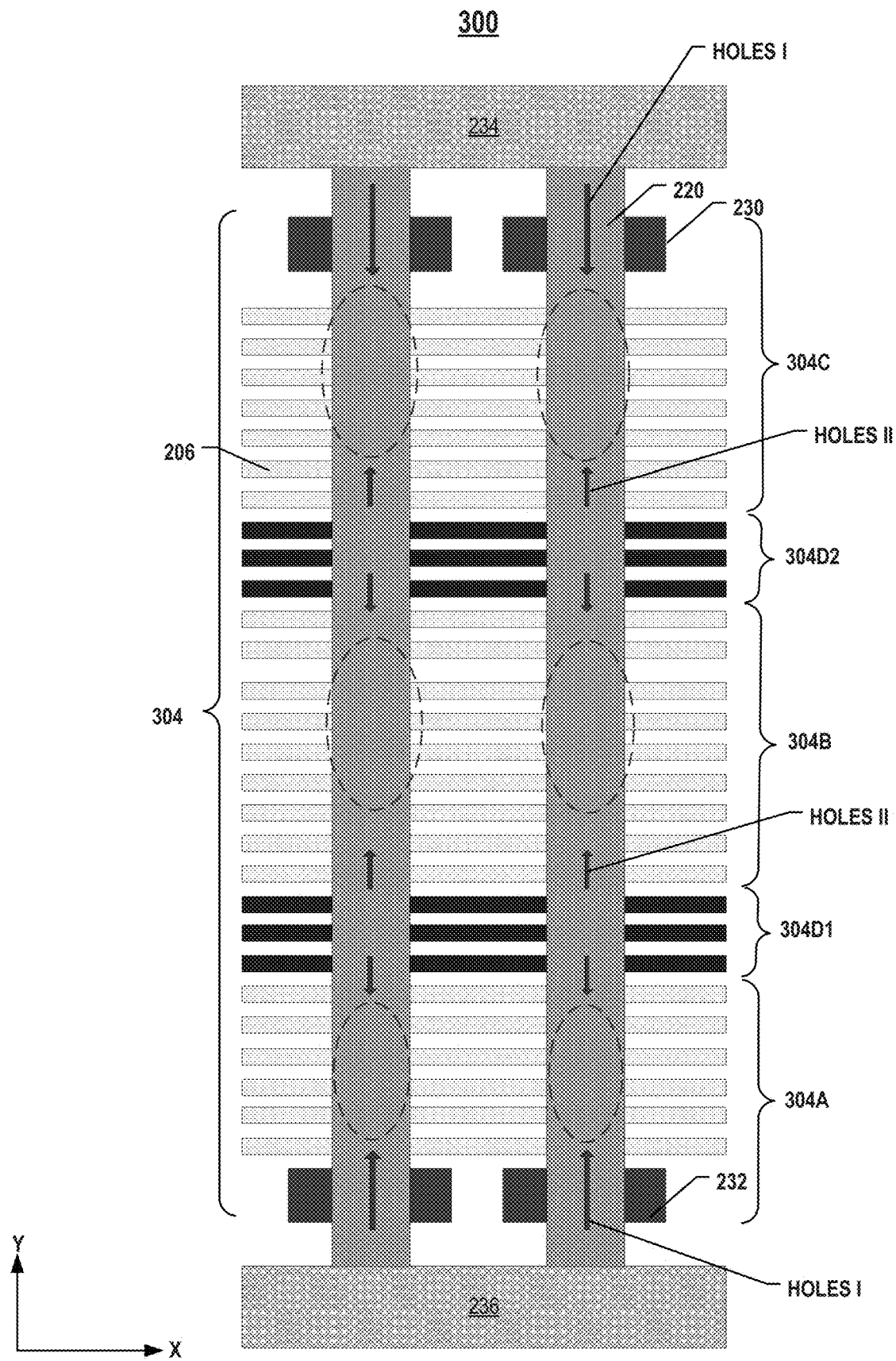
FIG. 3 illustrates certain elements of another exemplary memory array device, according to some aspects of the present disclosure.

FIG. 3 illustrates certain elements of memory array device 300 during an erase operation scheme for memory array device 300, according to some implementations. For ease of illustration, elements similar to or the same as those in memory array device 200 are depicted with the same numerals and the detailed description of these element are not repeated herein. Different from memory array device 200, memory array device 300 may include a triple-deck architecture with dummy memory layers between adjacent memory decks. As shown in FIG. 3, memory array device 300 may include a lower memory deck 304A, a middle memory deck 304B over lower memory deck 304A, and an upper memory deck 304C over middle memory deck 304B. Each memory deck, similar to memory deck 204A or 204B, may include a plurality of gate conductive layers 206 (e.g., memory layers) extending laterally in the memory deck. The number of gate conductive layers 206 in each deck may be the same as or different from that for memory deck 204A/204B and is not limited by the implementations herein. Memory array device 300 may also include a first group of dummy memory layers 304D1 located between lower memory deck 304A and middle memory deck 304B, and a second group of dummy memory layers 304D2 between middle memory deck 304B and upper memory deck 304C.

As described above, in a GIDL erase operation, bit line 234 and source line 236 may each be applied with a high positive voltage to generate BTBT current, which includes holes I that are injected from the upper and lower portions of semiconductor channel 220 towards to the middle portion of semiconductor channel 220. The erase operation of the present disclosure may be performed in combination with the GIDL erase operation such that a respective positive voltage may be applied on each group of dummy memory layers. In some implementations, a respective positive voltage is applied on first group of dummy memory layers 304D1, and a respective positive voltage is applied on second group of dummy memory layers 304D2. The voltages may be the same or different. In some implementations, the voltages applied on groups of dummy memory layers 304D1 and 304D2 have the same value, which ranges from 12 V to 20 V, e.g., each being 16 V.

As shown in FIG. 3, during the erase operation, BTBT current may be generated in semiconductor channel 220, e.g., between DSG line 230 and SSG line 232. As shown in FIG. 3, BTBT current are generated in semiconductor channel 220 at the intersections between 3D NAND memory string 210 and first group of dummy memory layers 304D1 and between 3D NAND memory string 210 and second group of dummy memory layers 304D2. The BTBT current may include holes II, which are injected towards the upper and lower portions of semiconductor channel 220 (e.g., in the positive y-direction and negative y-direction), as shown in FIG. 3. The threshold voltages of the memory cells (e.g., memory cells 106) in the memory blocks being erased (e.g., memory block 120, above dummy memory layers 304D2, below dummy memory layers 304D1, and between dummy memory layers 304D1 and 304D2) may be decreased. Accordingly, the memory cells are erased. As such, the holes in the circled portions of semiconductor channel 220 may include holes I and II, and the density of holes in these portions may thus be increased. In some implementations, holes are distributed in memory cells, formed by 3D NAND memory string 210, with increased uniformity. Compared to a memory array device without the disclosed erase operation scheme, a nonzero voltage (e.g., positive voltage) is applied on some of the memory layers (i.e., dummy memory layers 304D1 and 304D2) to generate additional holes for erase operation, and the number and/or density of holes in memory cells (e.g., memory cells 106) of memory block 120 may be increased and/or more uniform. The decrease of threshold voltages of the memory cells is more uniform. The erase operation of memory cells 106 may have higher efficiency and uniformity.

It should be understood that, memory array devices 200 and 300 are merely examples of the present disclosure and are not meant to limit the exact number of groups of dummy memory layers or the positions of the groups of dummy memory layers in any suitable memory array devices. Although not shown, memory array devices 200 and 300 may each include additional groups of dummy memory layers in one or more memory decks, if necessary, to increase the density and uniformity of holes in the memory cells, so as to improve the erase operation. The number of groups of dummy memory layers should not be limited by the number of decks in the memory array device. In an example, a dual-deck memory array device may include any suitable number of groups of dummy memory layers, e.g., two groups, three groups, four groups, or even more, respectively distributed at suitable depths/locations in the memory array device. The specific number and positions of these dummy memory layers and the values of positive voltages applied on the dummy memory layers should be determined based on factors such as the architecture of the respective memory array device and the desired density of holes in the memory cells, and should not be limited by the disclosed implementations of the present disclosure.

It should also be understood that, although not shown, the disclosed erase operation, which employs generating and injecting holes between DSG line 230 and SSG line 232, can also be performed alone, e.g., without a GIDL erase operation. For example, a suitable positive voltage can be applied on the dummy memory layers to generate holes during an erase operation. If a desired density of holes can be met in the memory cells using the disclosed erase operation and without the injection of holes from the upper and lower portions of semiconductor channel 220, the bit-line voltage and source-line voltage may each be 0 V during the erase operation. In various implementations, $V_{DSG}$ and $V_{SSG}$ can each be 0 V or a positive bias voltage during the erase operation in the erase operation.

Figure 4A:
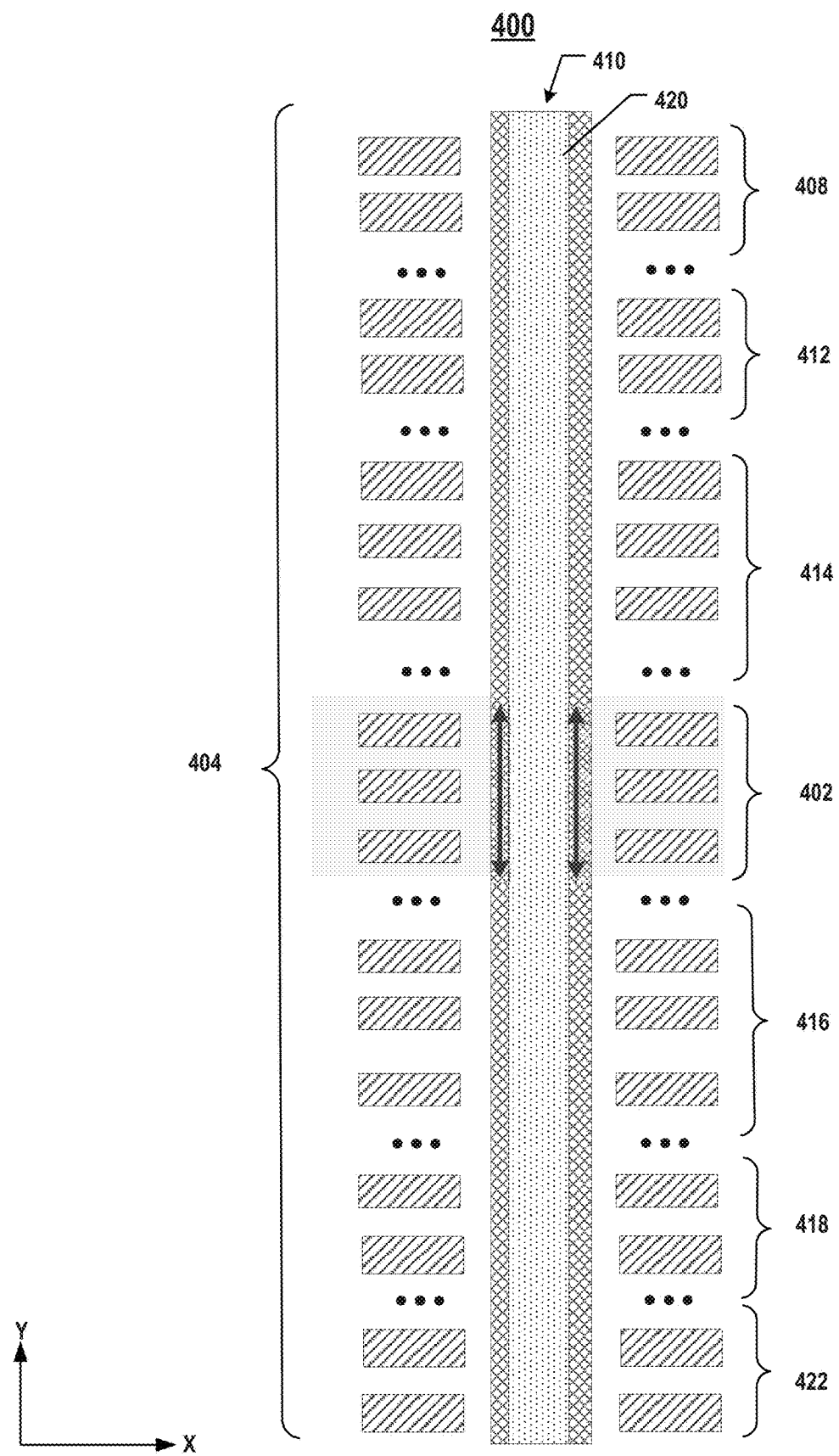
FIG. 4A illustrates an erase operation scheme for a 3D NAND memory device, according to some aspects of the present disclosure.
Figure 4B:
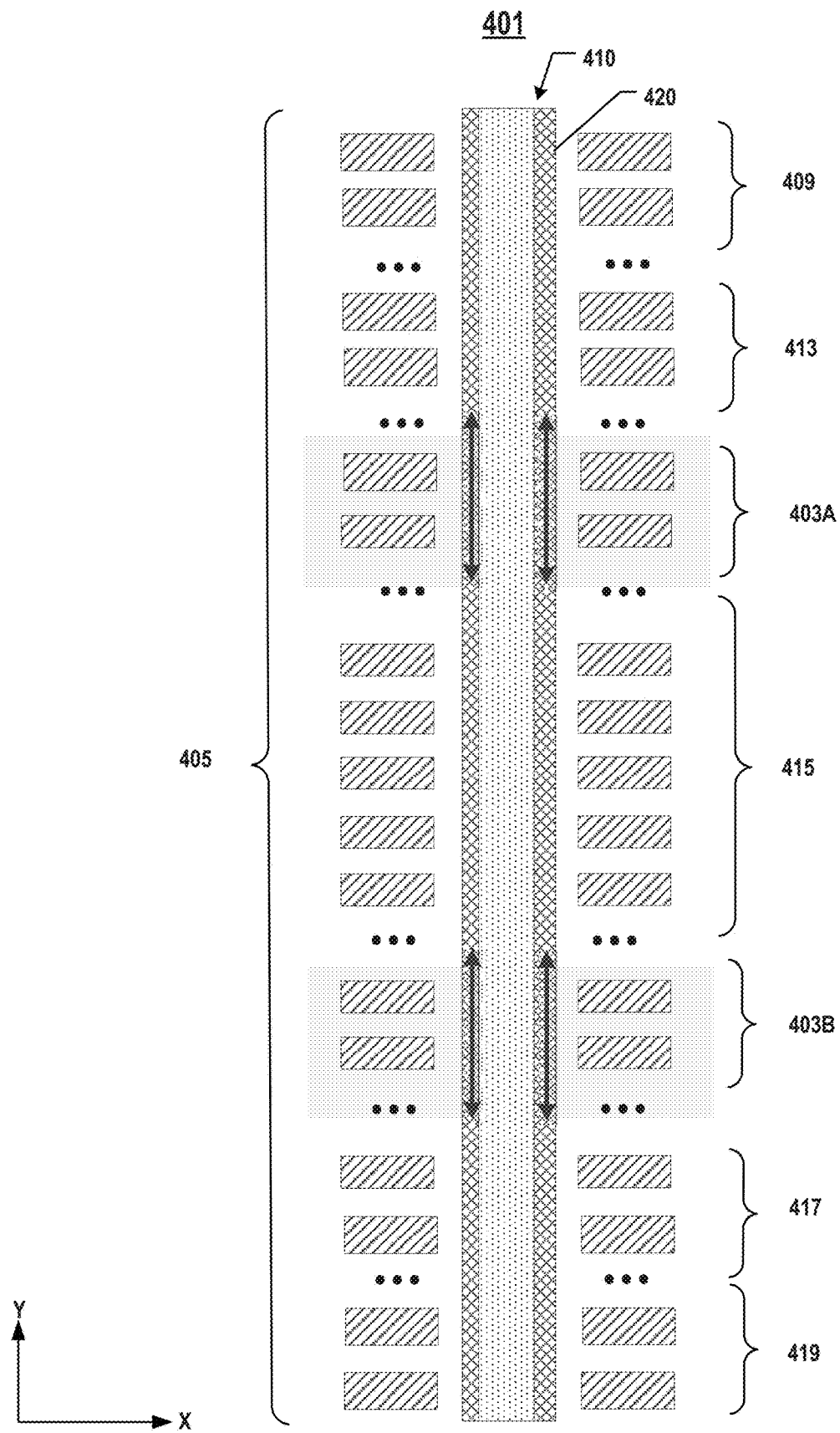
FIG. 4B illustrates an erase operation scheme for another 3D NAND memory device, according to some aspects of the present disclosure.
Figure 5:
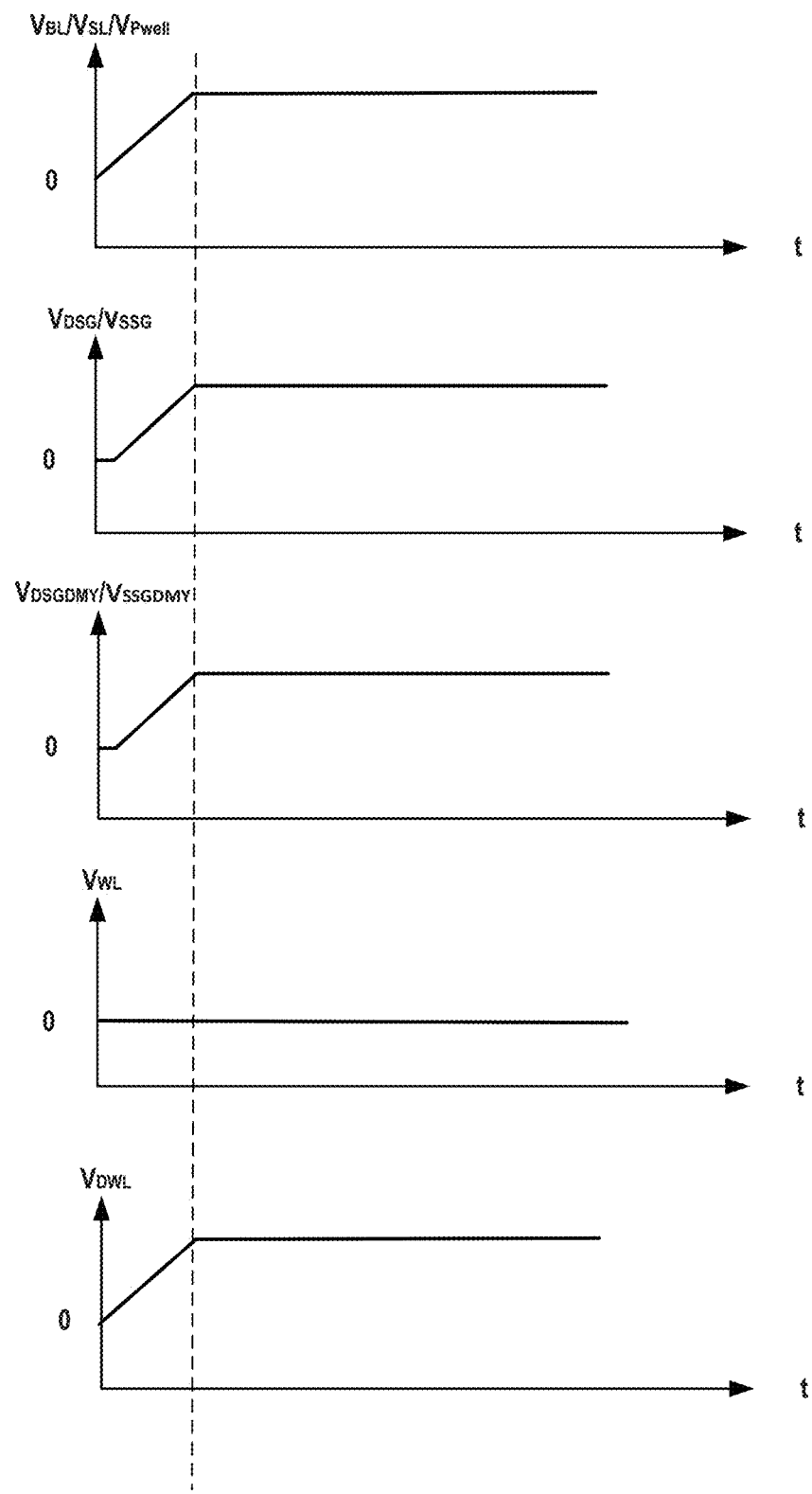
FIG. 5 illustrates a timing diagram of bias voltages for operating a 3D NAND memory device, according to some aspects of the present disclosure.
Figure 6:
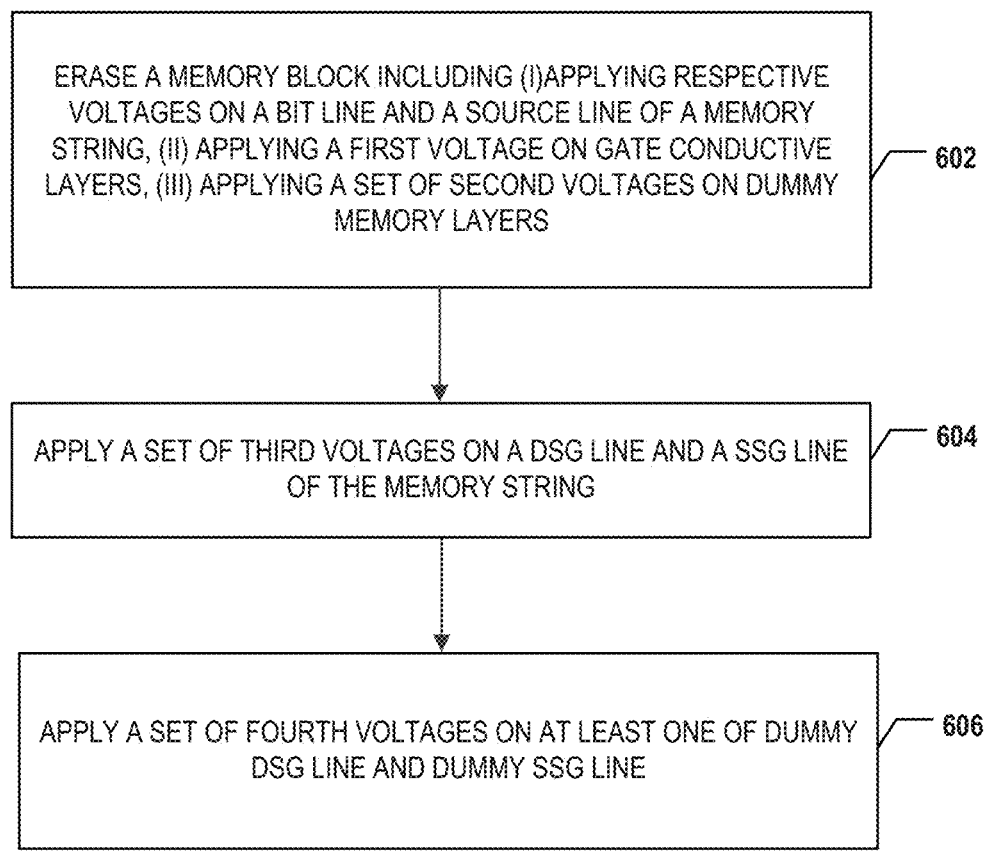
FIG. 6 is a flowchart of an exemplary method for operating an erase operation on a 3D memory device, according to some aspects of the present disclosure.

FIG. 4A illustrates certain elements of a 3D NAND memory device 400 having a single group of dummy memory layers during an erase operation, and FIG. 4B illustrates certain elements of a 3D memory device 401 having two groups of dummy memory layers during an erase operation, according to some aspects. FIG. 5 illustrates the timing diagram of certain bias voltages during an erase operation, according to some aspects. FIG. 6 is a flowchart of an exemplary method 600 for operating a 3D memory device, according to some aspects of the present disclosure. Examples of the 3D memory device depicted in FIG. 6 include memory array devices 200, 300, 401, and 402 depicted in FIGS. 2A and 2B, 3, 4A, and 4B, respectively. For ease of illustration, FIGS. 4A, 4B, 5, and 6 are described together. It is understood that the operations shown in method 600 are not exhaustive and that other operations can be performed as well before, after, or between any of the illustrated operations. Further, some of the operations may be performed simultaneously, or in a different order than shown in FIG. 6. The bit line and the source line of the memory strings in 3D memory devices 400 and 401 may be respectively similar to bit line 234 and source line 236 and are not shown in FIGS. 4A and 4B.

As shown in FIG. 4A, 3D memory device 400 may include a memory stack 404, which includes a plurality of memory layers in the vertical direction. 3D memory device 400 may also include a memory string 410, which includes a semiconductor channel 420, extending in the vertical direction through memory stack 404. In various implementations, memory stack 404 may have a single-deck architecture or a multi-deck architecture. The memory layers in memory stack 404 may include one or more memory layers 408 functioning as a DSG line (e.g., DSG line 230) of 3D memory device 400, one or more memory layers 422 functioning as an SSG line (e.g., SSG line 232) of 3D memory device 400, and a group of dummy memory layers 402 between memory layers 408 and 422. The memory layers may also include one or more memory layers 414 functioning as gate conductive layers (e.g., gate conductive layers 206) between memory layers 408 and dummy memory layers 402, and one or more memory layers 416 functioning as gate conductive layers between memory layers 422 and dummy memory layers 402. In some implementations, the memory layers may also include one or more memory layers 412 functioning as a dummy DSG line between memory layers 408 and 414. In some implementations, the memory layers may also include one or more memory layers 418 functioning as a dummy SSG line between memory layers 416 and 422. During an erase operation, a dummy DSG line driving circuit (e.g., dummy DSG line driving circuit 130) in a peripheral circuit (e.g., peripheral circuit 104) of 3D memory device 400 may apply suitable bias voltages on memory layers 412, and a dummy SSG line driving circuit (e.g., dummy SSG line driving circuit 134) in a peripheral circuit (e.g., peripheral circuit 104) of 3D memory device 400 may apply suitable bias voltages on memory layers 418. In some implementations, a DSG line is electrically coupled to a DSG of a transistor for applying a select or deselect voltage, and a SSG line is electrically coupled to an SSG of a transistor for applying a select or deselect voltage. A gate conductive layer is electrically coupled to a gate electrode of a memory cell for applying a gate voltage. A dummy DSG line, a dummy SSG line, and a dummy memory layer are each electrically coupled to a transistor for applying a suitable voltage, e.g., positive voltage, for generating a higher hole density in the erase operation.

Referring to FIG. 6, method 600 starts at operation 602, in which an erase operation is being performed when (i) respective voltages are applied on the bit line and the source line of a memory string, (ii) a first voltage is applied on gate conductive layers, and (iii) a set of second voltages are applied on dummy memory layers.

As shown in FIGS. 4A and 5, at the beginning of the erase operation, e.g., time=0, the bit line driving circuit of 3D memory device 400 (e.g., bit line driving circuit 124) may apply a bit-line voltage $V_{BL}$ on the bit line electrically connected to memory string 410, and the source line driving circuit of 3D memory device 400 (e.g., source line driving circuit 126) may apply a source-line voltage $V_{SL}$ on the source line electrically connected to memory string 410. $V_{BL}$ and $V_{SL}$, although illustrated in the same timing diagram, may have the same or different values. In some implementations, the $V_{BL}$ and $V_{SL}$ may be sufficiently high to trigger BTBT current (e.g., a GIDL erase operation) in 3D memory device 400. In some implementations, $V_{BL}$ and $V_{SL}$ may each range from 20 V to 25 V. For example, $V_{BL}$ and $V_{SL}$ may each be equal to 20 V. In some implementations, when the erase operation scheme is used in combined with a P-well erase operation, $V_{Pwell}$ is applied on the P-type doped region coupled to memory string 410. $V_{Pwell}$, although illustrated in the same timing diagram with $V_{BL}$ and $V_{SL}$, may have the same value or a different value. In some implementations, $V_{Pwell}$ may be a sufficiently high positive voltage and range from 15 V to 21 V.

In the meantime, at time=0, the word line driving circuit of 3D memory device 400 may apply a first voltage on gate conductive layers and a set of second voltages on dummy memory layers. The first voltage may include a suitable bias voltage $V_{WL}$ for erasing memory cells formed by the gate conductive layers, e.g., memory layers 414 and 416. In some implementations, $V_{WL}$ has a value of 0 V. The set of second voltages may include one or more voltages of the same value or of different values, each in a range of 12 V to 20 V. In some implementations, second voltages are equal to each other, having a value of $V_{DWL}$, and may be sufficiently high to trigger BTBT current in semiconductor channel 420.

Method 600 proceeds to operation 604, as illustrated in FIG. 6, in which a set of third voltages are applied on a DSG line and an SSG line of the memory string. As shown in FIGS. 4A and 5, the set of third voltages may include $V_{DSG}$ and $V_{SSG}$ for respectively applying on the DSG line and SSG line of memory string 410. Although drawn in the same timing diagram, $V_{DSG}$ and $V_{SSG}$ may have the same value of different values. In some implementations, the DSG line driving circuit of 3D memory device 400 may apply $V_{DSG}$ on memory layers 408 and/or the SSG line driving circuit may apply $V_{SSG}$ on memory layers 422 $V_{DSG}$ and $V_{SSG}$ may each be higher than 0 V and lower than each of $V_{BL}$ and $V_{SL}$. In some implementations, $V_{DSG}$ and $V_{SSG}$ may range from 12 V to 16 V. The values of $V_{DSG}$ and $V_{SSG}$ may optimize the condition for generating BTBT current in semiconductor channel 420.

Method 600 proceeds to operation 606, as illustrated in FIG. 6, in which a set of fourth voltages are applied on at least one of a dummy DSG line and a dummy SSG line.

As shown in FIGS. 4A and 5, the set of fourth voltages may include a plurality of bias voltages for respectively applying on dummy DSG line and/or dummy SSG line. In some implementations, voltages applied on dummy DSG line have the same value $V_{DSGDMY}$, and voltages applied on dummy SSG have the same value $V_{SSGDMY}$. Although drawn in the same timing diagram, $V_{DSGDMY}$ and $V_{SSGDMY}$ may have the same value of different values. In some implementations, a dummy DSG line driving circuit of 3D memory device 400 may apply $V_{DSGDMY}$ on memory layers 412, and/or a dummy SSG line driving circuit of 3D memory device 400 may apply $V_{SSGDMY}$ on memory layers 418. $V_{DSGDMY}$ and $V_{SSGDMY}$ may each range from 0 V to 10 V. The values of $V_{DSGDMY}$ and $V_{SSGDMY}$ may optimize the condition for generating BTBT current in semiconductor channel 420.

Method 600 may also be employed to erase memory cells in 3D memory device 401. 3D memory device 401 may include a memory stack 405, which includes a plurality of memory layers in the vertical direction. 3D memory device 401 may also include a memory string 410, which includes a semiconductor channel 420, extending in the vertical direction through memory stack 405. In various implementations, memory stack 405 may have a single-deck architecture or a multi-deck architecture. Different from 3D memory device 400, memory stack 405 may include two groups of dummy memory layers 403A and 403B. The memory layers in memory stack 405 may include one or more memory layers 409 functioning as a DSG line (e.g., DSG line 230) of 3D memory device 401, and one or more memory layers 419 functioning as an SSG line (e.g., SSG line 232) of 3D memory device 401. The memory layers may include one or more memory layers 415 functioning as gate conductive layers (e.g., gate conductive layers 206) between groups of dummy memory layers 403A and 403B. In some implementations, the memory layers may also include one or more memory layers 413 functioning as a dummy DSG line between memory layers 409 and dummy memory layers 403A. In some implementations, the memory layers may also include one or more memory layers 417 functioning as a dummy SSG line between memory layers 419 and dummy memory layers 403B. During an erase operation, the dummy DSG line driving circuit and/or the dummy SSG line driving circuit in a peripheral circuit (e.g., peripheral circuit 104) of 3D memory device 401 may apply the bias voltages on the respective memory layers.

At the beginning of an erase operation, e.g., at time=0, the bit line driving circuit of 3D memory device 401 (e.g., bit line driving circuit 124) may apply a bit-line voltage $V_{BL}$ is applied on the bit line electrically connected to memory string 410, and the source line driving circuit of 3D memory device 401 (e.g., source line driving circuit 126) may apply a source-line voltage $V_{SL}$ on the source line electrically connected to memory string 410. In the meantime, a first voltage may be applied on gate conductive layers, e.g., memory layers 415, and a set of second voltages may be applied on dummy memory layers 403A and 403B. The set of second voltages may include one or more voltages of the same value or of different values, each in a range of 12 V to 20 V. In some implementations, the second voltages are equal to each other, having a value of $V_{DWL}$, and may be sufficiently high to trigger BTBT current in semiconductor channel 420. In some implementations, the first voltage has a value of $V_{WL}$, equal to 0 V.

In some implementations, $V_{DSG}$ may be applied on memory layers 409 and/or $V_{SSG}$ may be applied on memory layers 419 at time=0. $V_{DSG}$ and $V_{SSG}$ may each be higher than 0 V and lower than each of $V_{BL}$ and $V_{SL}$. In some implementations, $V_{DSG}$ and $V_{SSG}$ may range from 12 V to 16 V. Meanwhile, a set of fourth voltages, including $V_{DSGDMY}$ and/or $V_{SSGDMY}$, may be respectively applied on memory layers 413 and/or memory layers 417. In some implementations, $V_{DSGDMY}$ and $V_{SSGDMY}$ may each range from 0 V to 10 V.

It should be noted that, in various embodiments, due to the design of the respective 3D NAND memory device, the exact time to apply the bias voltages for each component may vary, e.g., be slightly different. In some embodiments, the bias voltages can respectively reach the desired values at the same time for the erase operation to perform timely.

Figure 7A:
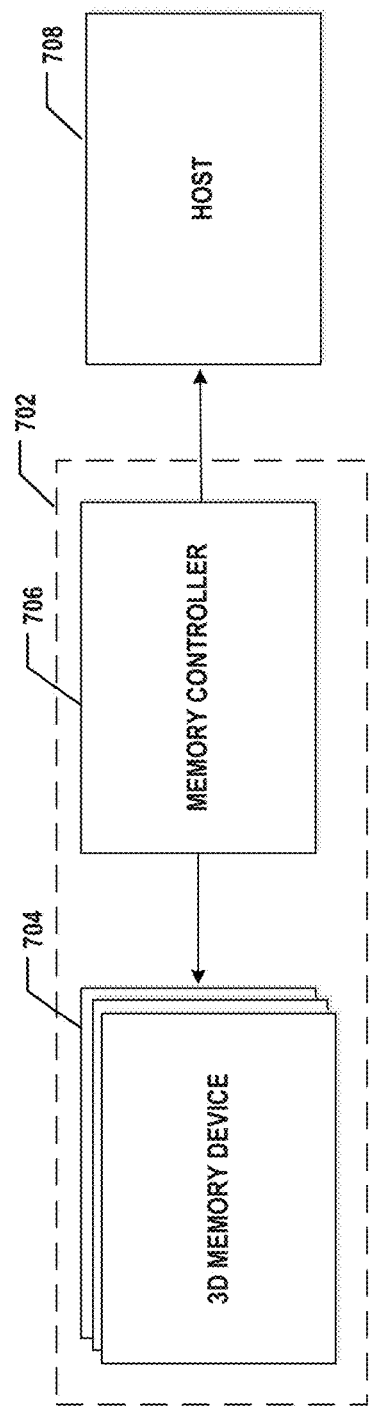
FIG. 7A illustrates a block diagram of an exemplary system having a memory device, according to some aspects of the present disclosure.

FIG. 7A illustrates a block diagram of an exemplary system 700 having a 3D memory device, according to some aspects of the present disclosure. System 700 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 7A, system 700 can include a host 708 and a memory system 702 having one or more 3D memory devices 704 and a memory controller 706. Host 708 can be a processor of an electronic device, such as a central processing unit (CPU), or a system-on-chip (SoC), such as an application processor (AP). Host 708 can be configured to send or receive the data to or from 3D memory devices 704.

3D memory device 704 can be any 3D memory devices disclosed herein, such as a 3D NAND Flash memory device. Consistent with the scope of the present disclosure, memory controller 706 (e.g., the peripheral circuits) may control the application of respective voltages on the dummy memory layers, memory layers, DSG lines, SSG lines, dummy DSG lines, dummy SSG lines, and bit lines such that the disclosed erase operation can be performed.

Memory controller 706 is coupled to 3D memory device 704 and host 708 and is configured to control 3D memory device 704, according to some implementations. Memory controller 706 can manage the data stored in 3D memory device 704, the operations in 3D memory device 704, and communicate with host 708. In some implementations, memory controller 706 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 706 is designed for operating in a high duty-cycle environment SSDs or embedded multi-media-cards (eMMCs) used as data storage for mobile devices, such as smartphones, tablets, laptop computers, etc., and enterprise storage arrays. Memory controller 706 can be configured to control operations of 3D memory device 704, such as read, erase, and program operations. Memory controller 706 can also be configured to manage various functions with respect to the data stored or to be stored in 3D memory device 704 including, but not limited to bad-block management, garbage collection, logical-to-physical address conversion, wear leveling, etc. In some implementations, memory controller 706 is further configured to process error correction codes (ECCs) with respect to the data read from or written to 3D memory device 704. Any other suitable functions may be performed by memory controller 706 as well, for example, erasing 3D memory device 704. Memory controller 706 can communicate with an external device (e.g., host 708) according to a particular communication protocol. For example, memory controller 706 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 7C:
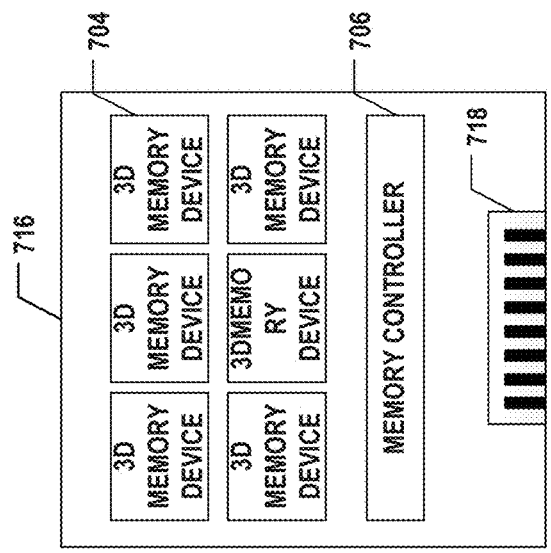
FIG. 7C illustrates a diagram of an exemplary solid-state drive (SSD) having a memory device, according to some aspects of the present disclosure.
Figure 7B:
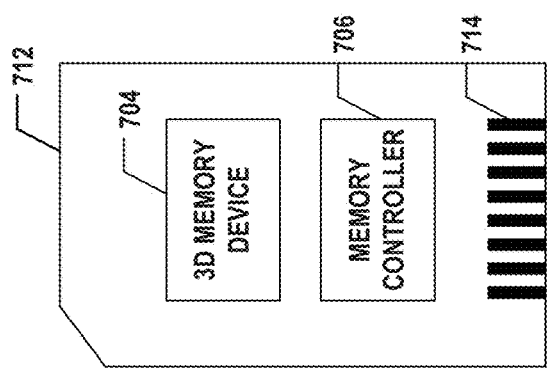
FIG. 7B illustrates a diagram of an exemplary memory card having a memory device, according to some aspects of the present disclosure.

Memory controller 706 and one or more 3D memory devices 704 can be integrated into various types of storage devices, for example, be included in the same package, such as a universal Flash storage (UFS) package or an eMMC package. That is, memory system 702 can be implemented and packaged into different types of end electronic products. In one example as shown in FIG. 7B, memory controller 706 and a single 3D memory device 704 may be integrated into a memory card 712. Memory card 712 can include a PC card (PCMCIA, personal computer memory card international association), a CF card, a smart media (SM) card, a memory stick, a multimedia card (MMC, MMCmicro), an SD card (SD, mini SD, microSD, SDHC), a UFS, etc. Memory card 712 can further include a memory card connector 714 coupling memory card 712 with a host (e.g., host 708 in FIG. 7A). In another example as shown in FIG. 7C, memory controller 706 and multiple 3D memory devices 704 may be integrated into an SSD 716. SSD 716 can further include an SSD connector 718 coupling SSD 716 with a host (e.g., host 708 in FIG. 7A). In some implementations, the storage capacity and/or the operation speed of SSD 716 is greater than those of memory card 712.

Implementations of the present disclosure provide a 3D memory device. The 3D memory device includes a plurality of memory layers and a dummy memory layer between the plurality of memory layers and a NAND memory string extending through the memory layers and the dummy memory layer. The NAND memory string includes a source, a drain, and a plurality of memory cells at intersections with the plurality of memory layers and between the source and the drain. The 3D memory device also includes a peripheral circuit configured to erase the plurality of memory cells. To erase the plurality of memory cells, the peripheral circuit includes a word line driving circuit configured to apply a positive bias voltage on the dummy memory layer.

In some implementations, the word line driving circuit is further configured to apply a ground voltage on the plurality of memory layers.

In some implementations, the plurality of memory layers are divided into a first memory deck and a second memory deck above the first memory deck. The dummy memory layer is between the first memory deck and the second memory deck.

In some implementations, the dummy memory layer includes a plurality of dummy memory layers arranged consecutively. In some implementations, the positive bias voltage includes a plurality of positive bias voltages at a same positive applied on the plurality of dummy memory layers, respectively.

In some implementations, to erase the plurality of memory cells, the peripheral circuit includes a source line driving circuit configured to apply a positive source-line voltage on the source of the NAND memory string and a bit line driving circuit configured to apply a positive bit-line voltage on the drain of the NAND memory string. The positive bias voltage on the dummy memory layer is lower than the positive source-line voltage and the positive bit-line voltage.

In some implementations, the positive source-line voltage and the positive bit-line voltage are each between 20 V to 25 V. In some implementations, the positive bias voltage is between 12 V to 20 V.

In some implementations, the positive source-line voltage and the positive bit-line voltage have a same value.

In some implementations, the NAND memory string further includes a DSG, and the peripheral circuit further includes a DSG line driving circuit configured to apply a positive DSG voltage on the DSG. The positive DSG voltage is lower than or equal to the positive bias voltage and is lower than each of the positive source-line voltage and the positive bit-line voltage.

In some implementations, the NAND memory string further includes a SSG, and the peripheral circuit further includes an SSG line driving circuit configured to apply a positive SSG voltage on the SSG. The positive SSG voltage is lower than equal to the positive bias voltage and is lower than each of the positive source-line voltage and the positive bit-line voltage.

In some implementations, the positive DSG voltage is between 10 V to 16 V.

In some implementations, the positive SSG voltage is between 10 V to 16 V.

In some implementations, the NAND memory string further includes a dummy DSG between the DSG and the plurality of memory layers. The peripheral circuit further includes a dummy DSG line driving circuit configured to apply a dummy DSG voltage on dummy DSG, the dummy DSG voltage being between 0 V to 10 V.

In some implementations, the NAND memory string further includes a dummy SSG between the SSG and the plurality of memory layers. The peripheral circuit further includes a dummy SSG line driving circuit configured to apply a dummy SSG voltage on the dummy SSG, the dummy SSG voltage being between 0 V to 10 V.

Implementations of the present disclosure provide a method for erasing memory cells in a 3D memory device. The 3D memory device includes a plurality of memory layers and a dummy memory layer between the plurality of memory layers, and a NAND memory string extending through the memory layers and the dummy memory layer. The NAND memory string includes a source, a drain, and a plurality of memory cells at intersections with the plurality of memory layers and between the source and the drain. The method includes applying a positive bias voltage on the dummy memory layer.

In some implementations, the method further includes applying a ground voltage on the plurality of memory layers.

In some implementations, the dummy memory layer includes a plurality of dummy memory layers arranged consecutively. In some implementations, applying the positive bias voltage includes applying a plurality of positive bias voltages at a same positive applied on the plurality of dummy memory layers, respectively.

In some implementations, the method also includes applying, respectively, a positive source-line voltage and a positive bit-line voltage on the source and the drain of the NAND memory string. The positive source-line voltage and the positive bit-line voltage are each higher than the positive bias voltage applied on the dummy memory layer.

In some implementations, the positive source-line voltage and the positive bit-line voltage are each between 20 V to 25 V. In some implementations, the positive bias voltage is between 12 V to 20 V.

In some implementations, the positive source-line voltage and the positive bit-line voltage have a same value.

In some implementations, the NAND memory string further includes a DSG. The method further includes applying a positive DSG voltage on the DSG. The positive DSG voltage is lower than or equal to the positive bias voltage and is lower than each of the positive source-line voltage and the positive bit-line voltage.

In some implementations, the NAND memory string further includes a SSG. The method further includes applying a positive SSG voltage on the SSG. The positive SSG voltage is lower than equal to the positive bias voltage and is lower than each of the positive source-line voltage and the positive bit-line voltage.

In some implementations, the positive DSG voltage is between 10 V to 16 V.

In some implementations, the positive SSG voltage is between 10 V to 16 V.

In some implementations, the NAND memory string further includes a dummy DSG between the DSG and the plurality of memory layers. The method further includes applying a dummy DSG voltage on dummy DSG. The dummy DSG voltage is between 0 V to 10 V.

In some implementations, the NAND memory string further includes a dummy SSG between the SSG and the plurality of memory layers. The method further includes applying a dummy SSG voltage on the dummy SSG. The dummy SSG voltage is between 0 V to 10 V.

Implementations of the present disclosure further provide a system. The system includes a 3D memory device configured to store data. The 3D memory device includes a plurality of memory layers and a dummy memory layer between the plurality of memory layers, and a NAND memory string extending through the memory layers and the dummy memory layer. The NAND memory string includes a source, a drain, and a plurality of memory cells at intersections with the plurality of memory layers and between the source and the drain. The 3D memory device also includes a peripheral circuit configured to erase the plurality of memory cells. To erase the plurality of memory cells, the peripheral circuit includes a word line driving circuit configured to apply a positive bias voltage on the dummy memory layer.

In some implementations, the word line driving circuit is further configured to apply a ground voltage on the plurality of memory layers.

In some implementations, the plurality of memory layers are divided into a first memory deck and a second memory deck above the first memory deck. In some implementations, the dummy memory layer is between the first memory deck and the second memory deck.

In some implementations, the dummy memory layer includes a plurality of dummy memory layers arranged consecutively, and the positive bias voltage includes a plurality of positive bias voltages at a same positive applied on the plurality of dummy memory layers, respectively.

In some implementations, the peripheral circuit further includes a source line driving circuit configured to apply a positive source-line voltage on the source of the NAND memory string. In some implementations, the peripheral circuit also includes a bit line driving circuit configured to apply a positive bit-line voltage on the drain of the NAND memory string. The positive bias voltage applied on the dummy memory layer is lower than the positive source-line voltage and the positive bit-line voltage.

In some implementations, the positive source-line voltage and the positive bit-line voltage are each between 20 V to 25 V; and the positive bias voltage is between 12 V to 20 V.

In some implementations, the positive source-line voltage and the positive bit-line voltage have a same value.

In some implementations, the NAND memory string further includes a DSG, and the peripheral circuit further comprises a DSG line driving circuit configured to apply a positive DSG voltage on the DSG. The positive DSG voltage is (i) lower than or equal to the positive bias voltage and (ii) lower than each of the positive source-line voltage and the positive bit-line voltage.

In some implementations, the NAND memory string further includes a SSG, and the peripheral circuit further comprises an SSG line driving circuit configured to apply a positive SSG voltage on the SSG. The positive SSG voltage is (i) lower than equal to the positive bias voltage and (ii) lower than each of the positive source-line voltage and the positive bit-line voltage.

In some implementations, the positive DSG voltage is between 10 V to 16 V.

In some implementations, the positive SSG voltage is between 10 V to 16 V.

In some implementations, the NAND memory string further includes a dummy DSG between the DSG and the plurality of memory layers. The peripheral circuit further includes a dummy DSG line driving circuit configured to apply a dummy DSG voltage on dummy DSG, the dummy DSG voltage being between 0 V to 10 V.

In some implementations, the NAND memory string further includes a dummy SSG between the SSG and the plurality of memory layers. In some implementations, the peripheral circuit further includes a dummy SSG line driving circuit configured to apply a dummy SSG voltage on the dummy SSG, the dummy SSG voltage being between 0 V to 10 V.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A three-dimensional (3D) memory device, comprising:
   a plurality of memory layers and a plurality of dummy memory layers, at least a first one of the plurality of dummy memory layers disposed between, and spaced apart from a first one and a second one of the plurality of memory layers;
   a NAND memory string extending through the plurality of memory layers and the plurality of dummy memory layers, the NAND memory string comprising a source, a drain, and a plurality of memory cells at intersections with the plurality of memory layers and between the source and the drain;
   a peripheral circuit configured to erase the plurality of memory cells, wherein, to erase the plurality of memory cells, the peripheral circuit comprises a word line driving circuit configured to apply a first positive bias voltage on the plurality of dummy memory layers; and
   the peripheral circuit further comprises a dummy drain-select line driving circuit configured to apply a second positive voltage to a dummy drain-select line during an erase operation, and a dummy source-select line driving circuit configured to apply a third positive voltage to a dummy source-select line during an erase operation.

2. The 3D memory device of claim 1, wherein the word line driving circuit is further configured to apply a ground voltage on the plurality of memory layers.

3. The 3D memory device of claim 1, wherein the plurality of memory layers are divided into a first memory deck and a second memory deck above the first memory deck, and wherein the at least one of the dummy memory layers is between the first memory deck and the second memory deck.

4. The 3D memory device of claim 1, wherein
   a first portion of the plurality of dummy memory layers are arranged consecutively.

5. The 3D memory device of claim 1, comprises:
   a source line driving circuit configured to apply a positive source-line voltage on the source of the NAND memory string; and
   a bit line driving circuit configured to apply a positive bit-line voltage on the drain of the NAND memory string, wherein the first positive bias voltage on the plurality of dummy memory layers is lower than the positive source-line voltage and the positive bit-line voltage.

6. The 3D memory device of claim 5, wherein
   the positive source-line voltage and the positive bit-line voltage are each between 20 V to 25 V; and
   the first positive bias voltage is between 12 V to 20 V.

7. The 3D memory device of claim 5, wherein the positive source-line voltage and the positive bit-line voltage have a same value.

8. The 3D memory device of claim 5, wherein the NAND memory string further comprises a drain-select gate (DSG), and the peripheral circuit further comprises a DSG line driving circuit configured to:
   apply a positive DSG voltage on the DSG, the positive DSG voltage being (i) lower than or equal to the first positive bias voltage and (ii) lower than each of the positive source-line voltage and the positive bit-line voltage.

9. The 3D memory device of claim 8, wherein the positive DSG voltage is between 10 V to 16 V.

10. The 3D memory device of claim 8, wherein the NAND memory string further comprises a dummy DSG between the DSG and the plurality of memory layers, wherein the dummy DSG line driving circuit is configured to:
    apply a voltage between 0 V to 10 V.

11. The 3D memory device of claim 5, wherein the NAND memory string further comprises a source-select gate (SSG), and the peripheral circuit further comprises an SSG line driving circuit configured to:
    apply a positive SSG voltage on the SSG, the positive SSG voltage being (i) lower than or equal to the first positive bias voltage and (ii) lower than each of the positive source-line voltage and the positive bit-line voltage.

12. The 3D memory device of claim 11, wherein the positive SSG voltage is between 10 V to 16 V.

13. The 3D memory device of claim 11, wherein the NAND memory string further comprises a dummy SSG between the SSG and the plurality of memory layers, wherein the dummy SSG line driving circuit is configured to:
    apply a dummy SSG voltage on the dummy SSG, the dummy SSG voltage being between 0 V to 10 V.

14. A method for erasing memory cells in a three-dimensional (3D) memory device, the 3D memory device comprising a plurality of memory layers and a plurality of dummy memory layers, at least one of the plurality of dummy memory layers disposed between, and spaced apart from a first one and a second one of the plurality of memory layers, and a NAND memory string extending through the plurality of memory layers and the plurality of dummy memory layers, the NAND memory string comprising a source, a drain, and a plurality of memory cells at intersections with the plurality of memory layers and between the source and the drain, the method comprising:
   applying, by a word line driving circuit, a first positive bias voltage on the plurality of dummy memory layers
   applying, by a dummy drain-select driving circuit, a second positive bias voltage on a dummy drain-select line; and
   applying, by a dummy source-select driving circuit, a third positive bias voltage on a dummy source-select line.

15. The method of claim 14, further comprising applying a ground voltage on the plurality of memory layers.

16. The method of claim 14, wherein:
   a first portion of the plurality of dummy memory layers are arranged consecutively.

17. The method of claim 14, further comprising:
   applying, respectively, a positive source-line voltage and a positive bit-line voltage on the source and the drain of the NAND memory string respectively, wherein the positive source-line voltage and the positive bit-line voltage are each higher than the first positive bias voltage applied on the plurality of dummy memory layers.

18. The method of claim 17, wherein
   the positive source-line voltage and the positive bit-line voltage are each between 20 V to 25 V; and
   the first positive bias voltage is between 12 V to 20 V.

19. The method of claim 14, wherein the NAND memory string further comprises a drain-select gate (DSG) and a source-select gate (SSG), the method further comprising:
   applying a positive DSG voltage on the DSG, the positive DSG voltage being (i) lower than or equal to the first positive bias voltage and (ii) lower than each of a positive source-line voltage and a positive bit-line voltage; and
   applying a positive SSG voltage on the SSG, the positive SSG voltage being (i) lower than or equal to the first positive bias voltage and (ii) lower than each of the positive source-line voltage and the positive bit-line voltage.

20. A system, comprising:
   a three-dimensional (3D) memory device configured to store data, the 3D memory device comprising:
   a plurality of memory layers and a plurality of dummy memory layers, at least a first one of the plurality of dummy memory layers disposed between, and spaced apart from a first one and a second one of the plurality of memory layers;
   a NAND memory string extending through the plurality of memory layers and the plurality of dummy memory layers, the NAND memory string comprising a source, a drain, and a plurality of memory cells at intersections with the plurality of memory layers and between the source and the drain;
   a peripheral circuit configured to erase the plurality of memory cells, wherein, to erase the plurality of memory cells, the peripheral circuit comprises:
   a word line driving circuit configured to apply a first positive bias voltage on the dummy memory layer;
   a dummy drain-select gate line driving circuit configured to apply a second positive bias voltage on a dummy drain-select gate line; and
   a dummy source-select gate line driving circuit configured to apply a third positive bias voltage on a dummy source-select gate line.

* * * * *